(12) United States Patent
Fournel

(10) Patent No.: US 7,023,060 B1
(45) Date of Patent: *Apr. 4, 2006

(54) METHODS FOR PROGRAMMING READ-ONLY MEMORY CELLS AND ASSOCIATED MEMORIES

(75) Inventor: Richard Pierre Fournel, Chemin de Fontanette (FR)

(73) Assignee: SGS-Thomson Microelectronics S.A., Gintilly (FR)

( * ) Notice: Subject to any disclaimer, the term of this patent is extended or adjusted under 35 U.S.C. 154(b) by 899 days.

This patent is subject to a terminal disclaimer.

(21) Appl. No.: 09/224,756

(22) Filed: Jan. 4, 1999

Related U.S. Application Data

(63) Continuation of application No. 08/688,298, filed on Jul. 30, 1996, now Pat. No. 6,144,078.

(30) Foreign Application Priority Data

Jul. 31, 1995 (FR) ................................. 95 09328

(51) Int. Cl.
*H01L 29/76* (2006.01)
*H01L 29/94* (2006.01)
*H01L 31/062* (2006.01)
*H01L 31/113* (2006.01)

(52) U.S. Cl. .................. 257/390; 257/402; 257/403; 257/404

(58) Field of Classification Search ............... 257/402, 257/390, 403, 404
See application file for complete search history.

(56) References Cited

U.S. PATENT DOCUMENTS

| 4,282,646 A | 8/1981 | Fortino et al. ............... 29/571 |
| 5,200,802 A | 4/1993 | Miller ....................... 257/390 |
| 6,144,078 A * | 11/2000 | Fournel ..................... 257/390 |

FOREIGN PATENT DOCUMENTS

EP       A-0 213 983      3/1987

OTHER PUBLICATIONS

French Search Report from French Patent Application 95 09328, filed Jul. 31, 1995.
Patent Abstracts of Japan, vol. 8, No. 221 (E-271)[1658], Oct. 9, 1984 & JP-A-59 103368 (Fujitsu KK).

* cited by examiner

*Primary Examiner*—Steven H. Loke
(74) *Attorney, Agent, or Firm*—Lisa K. Jorgenson; James H. Morris; Wolf, Greenfield & Sacks, P.C.

(57) ABSTRACT

A method for programming a read-only memory cell including a transistor whose source and drain, which have a second type of doping, are formed in a semiconductor substrate with a first type of doping, includes a step of carrying out a contradoping in a region of the source, the region being adjacent to the conduction channel 4, to make it a region with the first type of doping so as to prevent a transistor effect from occurring.

10 Claims, 3 Drawing Sheets

METHODS FOR PROGRAMMING READ-ONLY MEMORY CELLS AND ASSOCIATED MEMORIES

CROSS REFERENCE TO RELATED APPLICATIONS

This application is a continuation of application Ser. No. 08/688,298, filed Jul. 30, 1996, now U.S. Pat. No. 6,144,078, entitled METHODS FOR PROGRAMMING READ-ONLY MEMORY CELLS AND ASSOCIATED MEMORIES, which prior application is incorporated herein by reference.

BACKGROUND OF THE INVENTION

1. Field of the Invention

The invention relates to programming read-only memory (ROM) cells in MOS or CMOS technology.

2. Discussion of the Related Art

A programmed read-only memory cell and a non-programmed read-only memory cell show electrically different behavior when they are subjected to the same read signals, i.e., one of them conducts very little current or even no current at all, while the other conducts high current, at least ten to one hundred times higher than the former. Hereinafter, it shall be assumed, by convention, that the programmed cell is the one that conducts no current.

The manufacturers of read-only memories are particularly interested in methods that enable programming in the upper layers of the circuit, i.e., that come into play at an advanced stage of manufacture of the integrated circuit, even for example in the final layers.

In this field, there is in particular a known way of carrying out a drain contradoping operation for a transistor in a drain region adjacent to the conduction channel so as to have a reversed bias junction at the drain. This reversed bias junction, which is located upline with respect to the transistor, prevents the passage of the current in read mode. This programming method and the associated manufacturing method are described in the document EP 92830552.3 which is herein incorporated by reference.

This technique requires the making of a basic transistor (non-programmed) with a weakly doped drain and the carrying out of a deep (not surface) contradoping implantation to obtain a reversal of the type of doping throughout the depth of the region of the drain considered. With a more highly doped drain, there would remain a channel with the initial type of doping beneath this region and the desired effect would not be obtained. However, this weak doping of the drain and hence the low mobility of the carriers in the drain gives rise to high access resistance in the transistor and hence low current in reading mode even if the source is more highly doped in order to improve the conduction.

Furthermore, depending on the junction gradient obtained, which depends on the energy and the profile of implantation of the contradoping, it is possible to have a junction with a high breakdown voltage but also with substantial leakage currents, especially under heat. Or else, on the contrary, there may be a junction with leakage currents almost equal to zero, but then with a low breakdown voltage (abrupt junction). Now, firstly, the leakage currents are very inconvenient, and secondly if the breakdown voltage is very low, the junction will conduct current in reverse in read mode and the transistor will be read as being non-programmed. This is very inconvenient and calls for very painstaking operations to adjust the energy and doping levels in order to minimize the leakage currents while at the same time having sufficiently high breakdown voltage. The reproducibility of this programming method and hence its reliability are thereby affected.

An object of the invention is to provide a method of programming that does not have these different drawbacks, and an associated memory.

Another object of the invention is to provide a method of programming that can be carried out at an advanced stage of manufacture and is reliable and reproducible, and an associated memory.

SUMMARY OF THE INVENTION

An embodiment of the invention is directed to a method for programming a read-only memory cell including a transistor formed in a semiconductor substrate with a first type of doping, with a drain and a source having a second type of doping separated in the substrate by a conduction channel. The method includes a step of carrying out a contradoping on at least one region of the source, the region being adjacent to the conduction channel, to make it a region with a first type of doping so as to prevent a transistor effect from occurring.

Another embodiment of the invention is directed to a memory in integrated circuit form including programmed cells and/or non-programmed cells formed by a transistor, each transistor having a drain and a source separated by a conduction channel. The source of the transistor of each of the programmed cells comprises at least one region that is adjacent to the conduction channel and has the same type of doping as the channel.

BRIEF DESCRIPTION OF THE DRAWINGS

Other features and advantages of the invention are presented in the description given by way of an indication that in no way restricts the scope of the invention, and with reference to the appended figures, of which.

DETAILED DESCRIPTION

Figure 1:
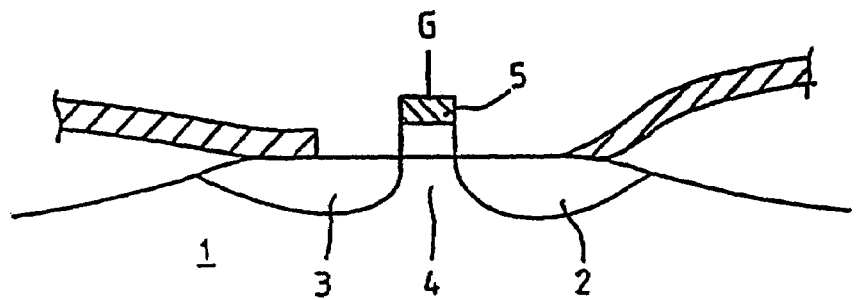
FIG. 1 shows a basic structure of a transistor of a read-only memory cell according to an embodiment of the invention.

As shown in FIG. 1, the basic structure of a read-only memory cell according to an embodiment of the invention is a transistor made in a semiconductor substrate 1 with a first type of doping. A drain 2 and a source 3 have a second type of doping. They are separated in the substrate by a conduction channel 4 located beneath a gate 5 of the transistor. In the example, the first type of doping is the p type doping and the second type doping is the n type doping.

Figure 2:
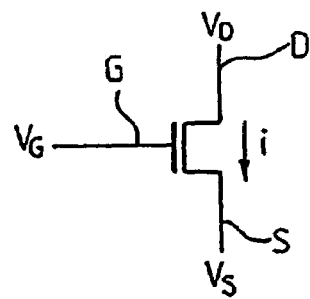
FIG. 2 shows an electrical diagram corresponding to the embodiment shown in FIG. 1.

The diagram of the corresponding transistor is shown in FIG. 2. A structure of this kind subjected to read voltages VG, VD, VS applied respectively to a gate line G, a drain line D and a source line S conducts a current i by transistor effect in the conduction channel (FIG. 2).

Programming this structure includes a step of making it non-conductive for these same read voltages.

According to an embodiment of the invention, the programming method includes carrying out a source contradoping and not a drain contradoping, as indicated in the document EP 92830552.3.

Figure 3:
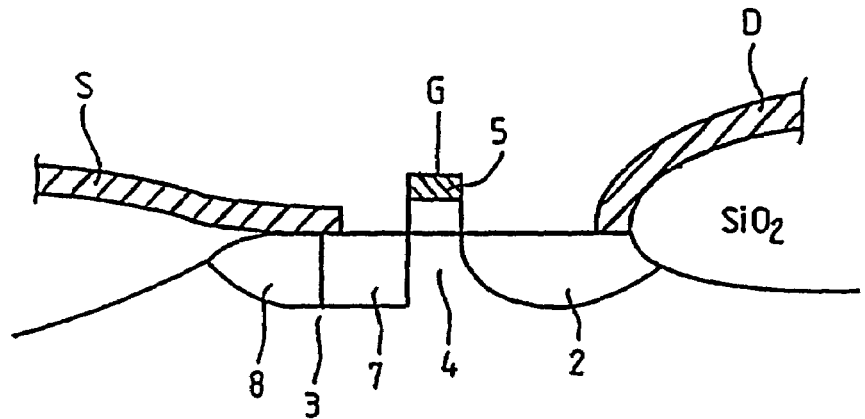
FIG. 3 shows the structure of a read-only memory cell programmed according to the programming method of an embodiment of the invention.

One structure obtained is shown in FIG. 3. In the example, a source contradoping has been made on a region 7 of the source 3. The region 7 is adjacent to the conduction channel 4. In this region, the doping becomes a doping of the first type. Seen from the conduction channel, the source and the drain have opposite types of doping. Furthermore, the region 7 increases the bias of the source with respect to the reference of the substrate, which is the ground in the example. The transistor effect in the conduction channel can no longer occur. There is a degenerate transistor. It is quite possible to apply the contradoping to the entire source (not shown) especially for an insulated cell (fuse) or only on a region of the source adjacent to the channel as shown.

For the manufacture of non-insulated cells (with common sources), the source of a degenerate transistor according to an embodiment of the invention may thus include a region 8 with the second type of doping, and the region 7, adjacent to the channel and having the same type of doping as the substrate. In this case, there is again a junction, but here it is a forward biased junction. It does not, in any way, play a role in the behavior of the degenerate transistor. Preferably, and as shown in FIG. 3, it is chosen to short circuit this junction. This is done simply with a source line coming into contact with the two regions 7 and 8.

In practice, to carry out the contradoping according to an embodiment of the invention, it is possible for example to apply the method for the contradoping of the drain, developed in the document EP 92830552.3, to the source or to a region of the source adjacent to the channel of the basic transistor of the invention.

In particular, to make it possible to carry out this contradoping of the source throughout the depth of the first implantation with impurities of the second type (n), it is necessary that this doping with impurities of the second type should be low (n−). The result thereof is high resistance in the source. To improve the conductivity of the non-programmed basic transistor (FIG. 1), it is preferably chosen to have a stronger doping of the drain (n+), hence a doping that is less resistive. The basic transistor will therefore be a transistor which has weak doping of the source and which, when programmed, will have a source including a region (7) adjacent to the channel and having the same type of doping as the substrate. If necessary, as seen here above, the source of the programmed transistor may include another region (8) having the same type of doping. It is then more weakly doped (n−) than the drain.

The principle of programming according to an embodiment of the invention, based on the degeneration of the structure of the basic transistor, differs totally from the method of programming by junction developed in the document EP 92830552.3.

In the embodiment of the invention, it is possible again to have a junction which, however, is forward-biased, has no role in the degenerescence of the transistor and furthermore can easily be short-circuited.

The embodiment of the invention is used to carry out the programming in the high layers of the circuit, namely very late in the manufacturing process after the making of the gates.

Steps of an exemplary method for the manufacture of a memory of programmed and non-programmed ROM cells according to an embodiment of the invention are thus shown in FIGS. 4 to 9.

Figure 4:
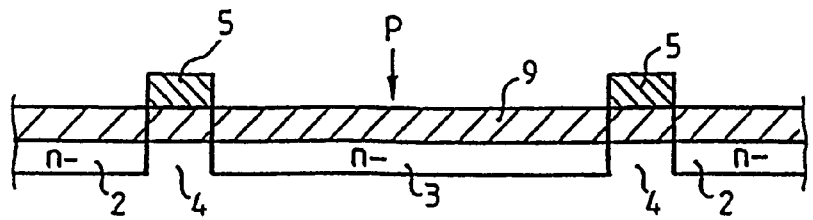
FIGS. 4 to 9 show different steps of an exemplary method for the manufacture of ROM cells according to an embodiment of the invention.

FIG. 4 shows a structure according to the embodiment after a step in the manufacture, in a P type substrate, of two transistors (not insulated) with a common source 3. The drains 2 and the common source 3 are weakly doped N type regions with ion implantation that is self-aligned on the polysilicon gates 5 of the transistors, through a thin oxide layer 9 deposited on the substrate.

Figure 5:
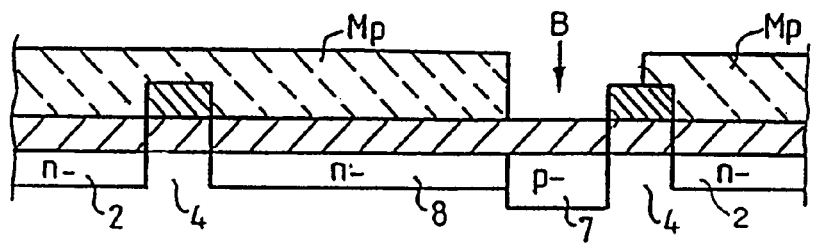

FIG. 5 shows the structure including programmed cells after a subsequent step. In the example illustrated by FIGS. 5 to 8, the right-hand cell is programmed while the left-hand cell is not programmed.

Thus, a P type implantation mask Mp has an aperture at the position of a region 7 of the source 3 of the right-hand transistor which is adjacent to the conduction channel 4. For example, the material used will be boron (B) for this ion implantation. A region 7 of the same type (p−) as the substrate is obtained.

Figure 6:
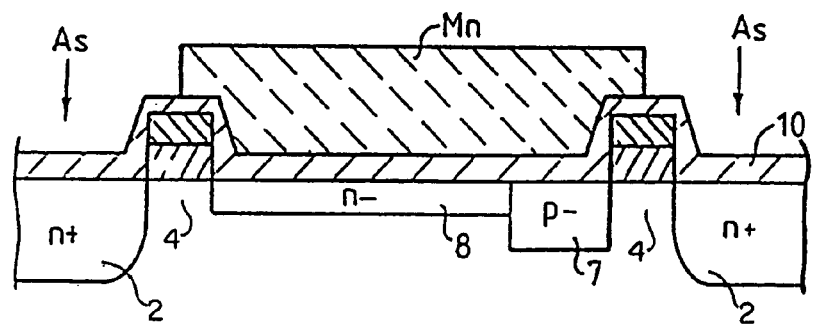

Preferably, to reduce the resistivity of the transistor, there is provided a step for implantation of N type impurities to obtain higher (n+) doping of the drains 2. FIG. 6 shows the structure after the implementation step. After having removed the layer 9 of thin oxide on the drains and source, the entire surface is reoxidized. A layer 10 of oxide is obtained. A mask Mn then protects the source, and arsenic (AS) is used to increase the doping of the drain regions. The drains become deeper, with a less abrupt junction on the gate side.

Then, the metal connections must be made on the source and drains.

Figure 7:
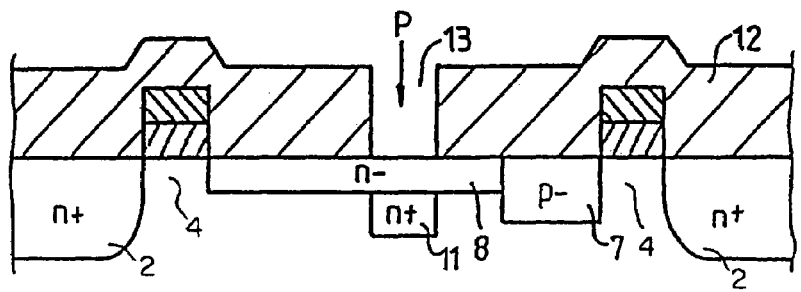

In the example shown, it is necessary, first of all, to make an n+ type region 11 beneath the n−type region 8 of the source 3 so that it is then possible to have appropriate metal contact with the source. This is what is shown in FIG. 7. A thick layer of insulator 12 is deposited and then an aperture 13 is made in this layer up to the surface of the substrate. A phosphorous implantation (P) enables the creation of the n+region 11 beneath the region 8.

The metal contacts can then be made on the source and drains (FIG. 8): apertures 14 and 15 are made in the layer of insulator for each drain. Then metal is deposited. This metal fills the source aperture 13 and the drain apertures 14 and 15.

Figure 8:
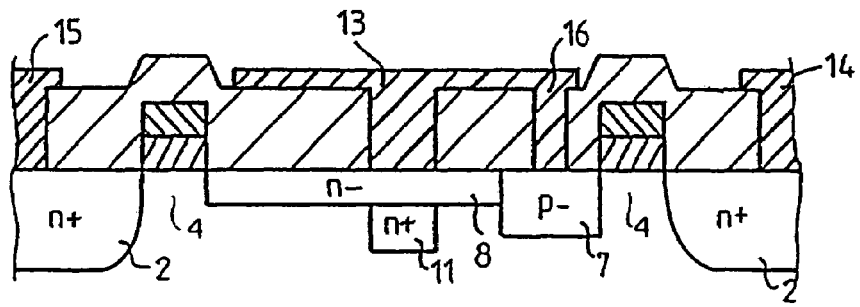
Figure 9:
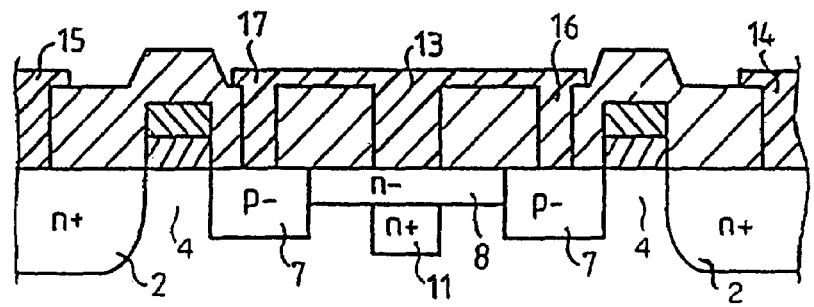

Preferably, and as shown in FIG. 8, there is provision for short-circuiting the regions 7 and 8 in the source. Hence an aperture 16 will also be made in the insulator at the level of this region 7, and the metal layer deposited on the source is such that it is continued between the two apertures 13 and 16 that it fills. In fact, the pattern of the metal deposit on the source is such that it could fill three apertures, i.e., that of the n−region and those of two p−regions on each side of the n−region when the transistors with a common source are both programmed. This is what is shown in FIG. 9.

A read-only memory in integrated circuit form will thus include, according to an embodiment of the invention, a matrix of programmed and/or non-programmed cells formed by a basic transistor according to an embodiment of the invention. The source of the transistor of each programmed cell will have a region adjacent to the channel having the same type of doping as the substrate to prevent the transistor effect from occurring. The source could also include another region having the same type of doping as the drain of the conduction channel of the transistor.

Finally, the description made with reference to the appended drawings refers to transistors made in a p type substrate. However, the present invention could equally well be applied to transistors made in an n type substrate or in n or p type wells.

Having thus described several particular embodiments of the invention, various alterations, modifications, and improvements will readily occur to those skilled in the art. Such alterations, modifications, and improvements as are made obvious by this disclosure are intended to be part of this disclosure though not expressly stated herein, and are intended to be within the spirit and scope of the invention. Accordingly, the foregoing description is by way of example only and is not intended to be limiting. The invention is limited only as defined in the following claims and equivalents thereto.

What is claimed is:

1. A method for programming a cell, comprising the steps of:
    forming, in a substrate of a first doping type, a first transistor having a drain of a second doping type, and a source of the second doping type at least a portion of which has a lower doping concentration than the drain, such that a portion of the substrate forms a conduction channel between the source and the drain; and
    contradoping only a first region of the source which directly contacts the conduction channel to make the first transistor degenerate.

2. The method of claim 1, wherein the step of contradoping includes the step of:
    dividing the source into the first region, and a second region.

3. A method for programming a read-only memory cell including a transistor formed in a semiconductor substrate of a first doping type, the transistor having a drain and a source of a second doping type separated in the substrate by a conduction channel, the method comprising a step of:
    contradoping a first region of the source such that the first region is of the first doping type to prevent a transistor effect from occurring, the first region directly contacting the conduction channel;
    wherein the step of contradoping includes a step of contradoping only the first region of the source of the transistor such that a second region of the source remains of the second doping type; and
    wherein the second region has a lower doping concentration than the drain of the transistor.

4. A memory, in integrated circuit form comprising:
    a plurality of transistors that form a corresponding plurality of memory cells, wherein each transistor has a drain and a source separated by a conduction channel, wherein a first transistor forms a corresponding programmed cell, and wherein the conduction channel and a first region of the source of the first transistor directly contact each other and wherein the first region is contradoped so that the first region and the conduction channel are of the same doping type, and wherein the drain is not contradoped;
    wherein a second region of the source has a lower doping concentration than the drain of the transistor.

5. The memory of claim 4, wherein the drain and the second region of the source of the first transistor are of the same doping type.

6. A memory, comprising:
    a plurality of cells formed in a substrate of a first doping type, the plurality of cells including a first programmed cell having a drain of a second doping type, a conduction channel of the first doping type, and a source, wherein the source includes a first region of the first doping type directly contacting the conduction channel;
    wherein a second region of the source has a lower doping concentration than the drain; and
    wherein the first region is the only region of the source that is contradoped.

7. The memory of claim 6, wherein the second region is of the second doping type and contacts the first region.

8. A memory, comprising:
    a plurality of cells formed in a substrate of a first doping type, the plurality of cells including a first programmed cell having a drain of a second doping type, a conduction channel of the first doping type, and a source including non-conducting means directly contacting the conduction channel and being contradoped for providing a non-conducting response in the conduction channel to prevent a transistor effect from occurring between the drain and the source when predetermined voltages are applied to the first programmed cell to read the first programmed cell;
    wherein a region of the source not including the non-conducting means has a lower doping concentration than the drain; and
    wherein the non-conducting means is the only region of the source that is contradoped.

9. The memory of claim 8, wherein the non-conducting means is a first region of the source of the first programmed cell contradoped such that the first region is of the first doping type to form a degenerate transistor as the first programmed cell.

10. The memory of claim 9, wherein the first region of the source of the first programmed cell has a doping concentration less than that of the drain.

* * * * *

UNITED STATES PATENT AND TRADEMARK OFFICE
CERTIFICATE OF CORRECTION

PATENT NO. : 7,023,060 B1
DATED : April 4, 2006
INVENTOR(S) : Richard Pierre Fournel It is certified that error appears in the above-identified patent and that said Letters Patent is hereby corrected as shown below:

<u>Title page,</u>
Item [73], Assignee, should read -- SGS-Thomson Microelectronics S.A., Gentilly, (FR) --.

Signed and Sealed this

Twenty-third Day of May, 2006

JON W. DUDAS
*Director of the United States Patent and Trademark Office*